(12) United States Patent
Manabe et al.

(10) Patent No.: US 8,077,532 B2
(45) Date of Patent: Dec. 13, 2011

(54) SMALL UNIT INTERNAL VERIFY READ IN A MEMORY DEVICE

(75) Inventors: Tetsuji Manabe, Kanagawa (JP); Satoru Tamada, Kamakura (JP)

(73) Assignee: Micron Technology, Inc., Boise, ID (US)

( * ) Notice: Subject to any disclaimer, the term of this patent is extended or adjusted under 35 U.S.C. 154(b) by 280 days.

(21) Appl. No.: 12/552,743

(22) Filed: Sep. 2, 2009

(65) Prior Publication Data

US 2011/0051523 A1  Mar. 3, 2011

(51) Int. Cl.
*G11C 29/00* (2006.01)
(52) U.S. Cl. ........................... 365/200; 365/201
(58) Field of Classification Search .................. 365/200, 365/201, 189.15; 714/719, 732
See application file for complete search history.

(56) References Cited

U.S. PATENT DOCUMENTS 7,137,050 B2 * 11/2006 Merritt et al. ................. 714/719

OTHER PUBLICATIONS

Chang Wan Ha, "Program and Sense Operations in a Non-Volatile Memory Device", U.S. Appl. No. 12/274,508, filed Nov. 20, 2008, 26 pgs.

* cited by examiner

*Primary Examiner* — Vu Le
(74) *Attorney, Agent, or Firm* — Leffert Jay & Polglaze, P.A.

(57) ABSTRACT

Methods for small unit internal verify read operation and a memory device are disclosed. In one such method, expected data is programmed into a grouping of columns of memory cells (e.g., memory block). Mask data is loaded into a third dynamic data cache of three dynamic data caches. The expected data is loaded into a second data cache. After a read operation of programmed columns of memory cells, the read data is compared to the expected data and error bit indicators are stored in the second data cache in the error bit locations. The second data cache is masked with the mask data so that only those error bits that are unmasked are counted. If the number of unmasked error bit indicators is greater than a threshold, the memory block is marked as unusable.

20 Claims, 6 Drawing Sheets

SMALL UNIT INTERNAL VERIFY READ IN A MEMORY DEVICE

TECHNICAL FIELD OF THE INVENTION

The present invention relates generally to memory and in a particular embodiment the present invention relates to non-volatile memory.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

During manufacture of non-volatile memory devices, the devices are tested for proper operation. Various data patterns are written to the memory blocks to test whether the memory cells are capable of being written to and read from. A certain number of bad memory blocks can be replaced with redundant memory blocks. If the number of bad memory blocks is found to be greater than a certain threshold, the memory device is discarded.

The testing of the memory blocks typically includes writing a known threshold voltage to a memory cell and then reading the value from the cell in the form of a bit line current. The read data that represents the read current from the bit line is compared to the expected data through an internal verify read operation to determine if a memory cell is defective. If the read data is different from the expected data, the memory cell is marked as defective. A judged current that represents the number of defective cells is compared to a reference current that represents the criteria of allowed error bits to determine if a memory block is unusable. If the judged current is greater than the reference current, the memory block is marked as unusable. The entire memory device is determined to be unusable, and is discarded, if the quantity of unusable memory blocks exceeds a certain threshold.

The criteria of allowed error bits are established during the design and manufacture of the memory device under test. The criteria are stored in a trim register of the memory device to be used during the testing process.

A problem with this method for determining unusable memory blocks is that the difference between the judged current and the reference current might be very small making it difficult to accurately measure. Thus, it is possible for a memory block to be marked as unusable even though it is substantially equal to the reference current or even a little less than.

For the reasons stated above, and for other reasons stated below that will become apparent to those skilled in the art upon reading and understanding the present specification, there is a need in the art to increase the reliability of determining unusable memory blocks.

DETAILED DESCRIPTION

Figure 3:
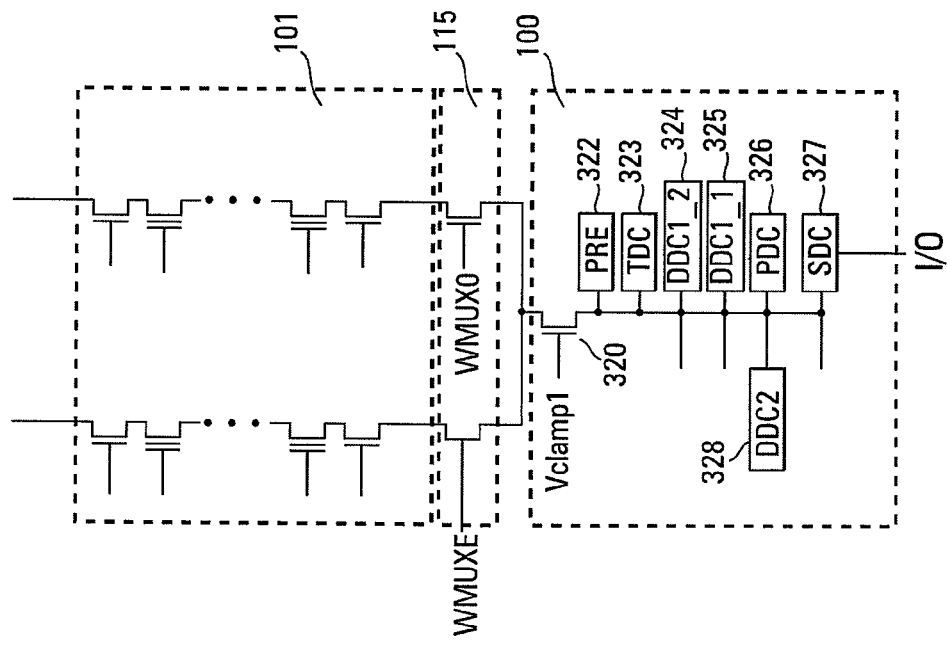
FIG. 3 shows a schematic diagram of one embodiment of the memory device of FIG. 1.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
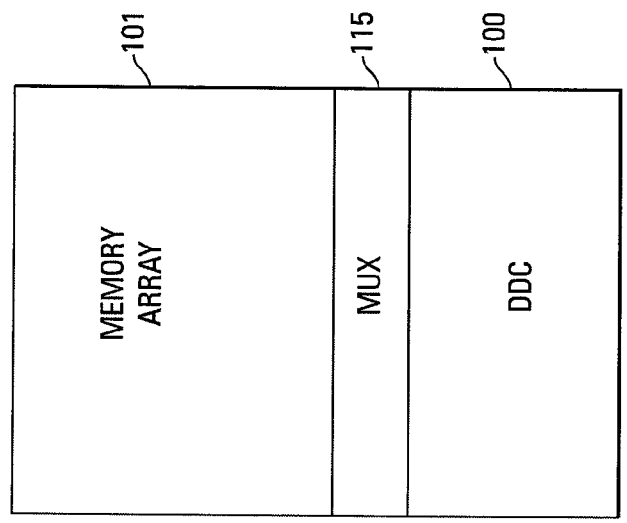
FIG. 1 shows a block diagram of one embodiment of a memory device in accordance with small unit internal verify read operation.

FIG. 1 illustrates a block diagram of one embodiment of a memory device that incorporates the small unit internal verify read operation of the present embodiments. The memory device is comprised of a memory array 101, a multiplexing circuit 115, and a dynamic data cache (DDC) 100.

The multiplexing circuit 115 selects between two or more bit lines of the memory array 101. As described subsequently with reference to the more detailed schematic of FIG. 3, the control signals to the multiplexing circuit 115 select which bit line is enabled to the DDC 100.

The DDC 100, as illustrated and described subsequently with reference to FIG. 3, provides temporary storage of data that has been sensed or is being programmed into the memory array 101. The DDC 100 can also provide precharging voltages for the bit lines during the sense and program operations. One circuit of the DDC 100 provides storage of the mask for the small unit internal verify read operation as described subsequently.

Figure 2:
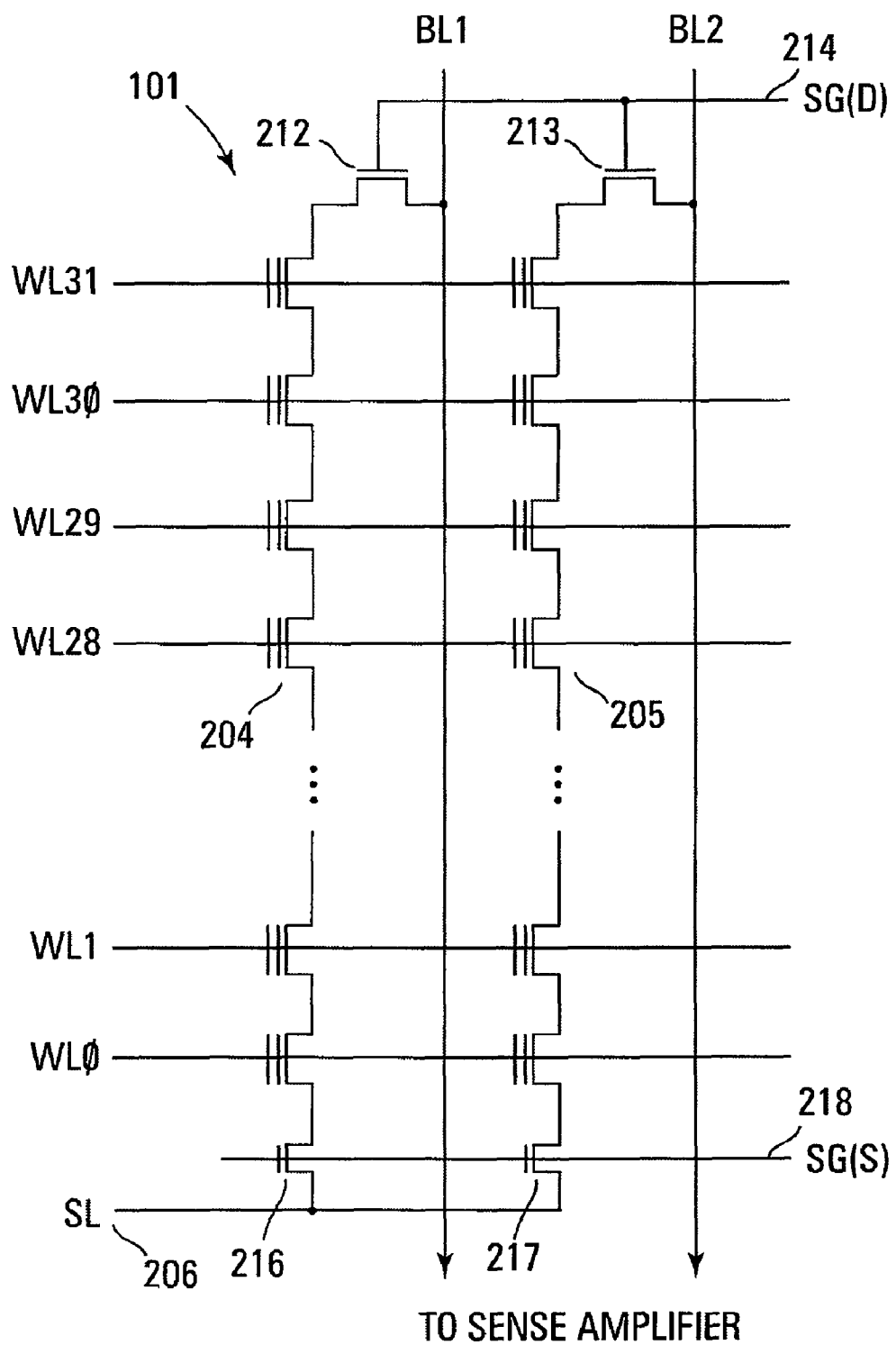
FIG. 2 shows a schematic diagram of one embodiment of series NAND strings of memory cells.

One embodiment of the memory array 101 of the memory device of FIG. 1 is illustrated in greater detail in FIG. 2. FIG. 2 illustrates a schematic diagram of a portion of a NAND architecture memory array 101 comprising series strings of non-volatile memory cells. While FIG. 2 and the subsequent discussions refer to a NAND memory device, the present embodiments are not limited to such an architecture but can be used in other memory device architectures as well.

The memory array 101 is comprised of an array of non-volatile memory cells (e.g., floating gate) arranged in columns such as series strings 204, 205. Each of the cells are coupled drain to source in each series string 204, 205. An access line (e.g. word line) WL0-WL31 that spans across multiple series strings 204, 205 is connected to the control gates of each memory cell in a row in order to bias the control gates of the memory cells in the row. The data lines (e.g., bit lines) BL1, BL2 are eventually connected to sense circuits (not shown) that detect the state of each cell by sensing voltage or current on a particular bit line.

Each series string 204, 205 of memory cells is coupled to a source line 206 by a source select gate 216, 217 and to an individual bit line BL1, BL2 by a drain select gate 212, 213. The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or multiple level cell (MLC). Each cell's threshold voltage ($V_t$) is indicative of the data that is stored in the cell. For example, in an SLC, a $V_t$ of 0.5V might indicate a programmed cell while a $V_t$ of –0.5V might indicate an erased cell. The MLC can have multiple $V_t$ voltage ranges that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

FIG. 3 illustrates a more detailed schematic of one embodiment of the memory device of FIG. 1. The function and composition of the memory array 101 has been described previously with reference to FIG. 2. For purposes of clarity, only one pair of odd/even bit lines are shown and described in this figure. However, it is understood by one skilled in the art that the memory array 101 can be comprised of hundreds of thousands or millions of bit lines, depending on the memory density.

The memory device is further comprised of a multiplexing circuit 115 that connects each odd/even bit line pair of the memory array 101 to the dynamic data cache (DDC) circuit 100. The multiplexing circuit 115 is comprised of a transistor coupled to each bit line. Each transistor has a control signal that turns on the transistor as required to allow the bit line access to the DDC 100. A WMUXE control signal enables transistors connected to even bit lines and a WMUXO control signal enables transistors connected to odd bit lines. Since the illustrated embodiment uses NMOS transistors, the WMUXE and WMUXO signals are active high to turn on the transistors. However, an alternate embodiment could use active low signals if PMOS transistors were substituted. The circuit shown for the DDC 100 is repeated for each odd/even pair of bit lines. In still other embodiments, other types of enable switches can be used in place of the WMUXE and WMUXO transistors.

The DDC circuit 100 is comprised of an access transistor 320 that connects the DDC 100 to the multiplexing circuit 115. When the control signal VCLAMP1 is high, this transistor 320 is turned on and connected to the bit line that is selected by the multiplexing circuit 115. As in above descriptions, the NMOS access transistor 320 can be a PMOS transistor if inverse logic for the control signal VCLAMP1 is used.

The DDC circuit 100 is further comprised of a precharge circuit 322. When the multiplexing circuit 115 connects one of the odd or even bit lines to the DDC 100, the precharge circuit 322 precharges that particular bit line prior to a sense operation.

A temporary data cache (TDC) 323 is used to temporarily store data during a program or sense operation. The data is stored in the TDC 323 before being moved to or after being moved from the primary data cache (PDC) 326, the secondary data cache (SDC) 327, DDC1_1 325, DDC1_2 324 or DDC2 328. If the present operation is a sense operation, the data in the TDC 323 is moved to the I/O line for use by external circuits such as a microprocessor that initiated the read operation. If the present operation is a program operation, the data in the TDC 323 is moved to the selected memory cell during the portion of the operation in which the selected memory cell is programmed with the data.

The main data storage portion of the DDC 100 is comprised of the DDC1_2 circuit 324, the DDC1_1 circuit 325, the DDC2 circuit 328, the PDC circuit 326, and the SDC circuit 327. The SDC circuit 327 is coupled to the I/O line for either receiving data for programming or transmitting data read from their respective bit lines to an external circuit.

In an SLC programming operation, if a logical '0' is being programmed to a selected memory cell, the bit line voltage for that cell is set to 0V by the PDC circuits 326. If a logical '1' is to be programmed, the bit line voltage is set to $V_{CC}$ from the PDC circuits 326. A logical '1' is an erased state and means no programming is to be done, thus the $V_{CC}$ on the bit line inhibits further programming of any cells coupled to that particular bit line. The DDC1_1 circuit 325, DDC1_2 circuit 324, and DDC2 circuit 328 are used for controlling multiple level programming and strong multiple level data for selected memory cells in combination with the PDC 326. During the small unit verify read operation, the DDC1_1 325 and DDC1_2 324 are used as temporary data storage (e.g., to compare read data with expected data). The DDC2 circuit 328 is used to store the mask data prior to the small unit internal verify read operation.

The PDC 326 stores data that has been sensed from their bit line's respective sense operation. Additionally, the PDC circuit 326 stores data for programming into their respective bit lines. Data from the PDC 326 is transferred to the TDC 323 immediately prior to programming. Data written to the PDC 326 is transferred from the TDC 323 immediately after the sense operation.

The SDC 327 is a secondary cache that stores data from an external circuit (e.g., microprocessor) for programming into a bit line (i.e., odd or even). The SDC 327 also acts as a pass through circuit for data that is output by the DDC 100.

Figure 4:
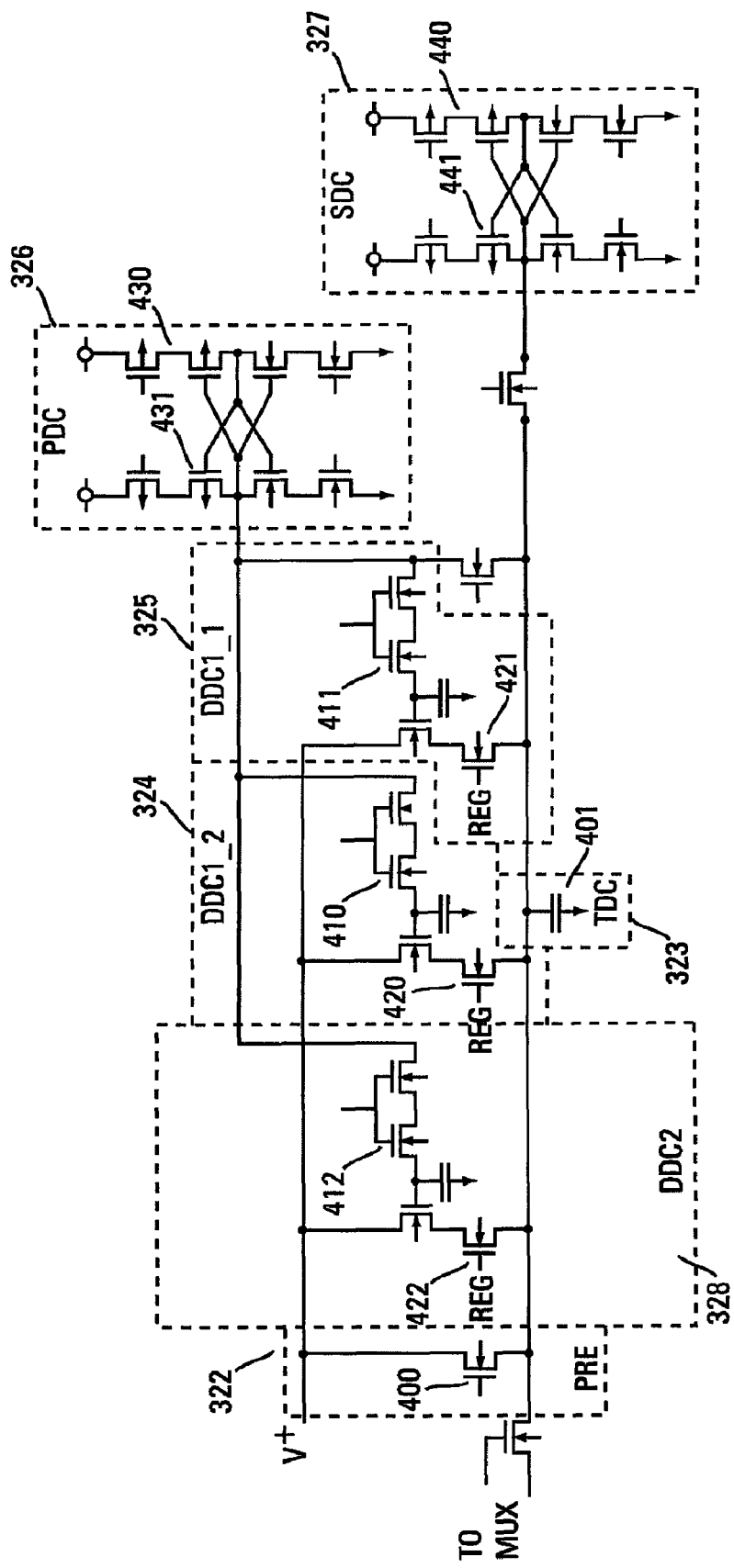
FIG. 4 shows a schematic diagram of one embodiment of the dynamic data cache in accordance with the memory device of FIGS. 1 and 3.

FIG. 4 illustrates a schematic diagram of one embodiment of the DDC 100 of FIGS. 1 and 3. This circuit 100 shows the PRE 322 precharge circuit, the TDC 323 temporary data cache, the mask storage cache DDC2 328 as well as the data storage portion of the DDC 100 that includes the DDC1_1 325, DDC1_2 324, PDC 326, and SDC 327.

The PRE circuit 322 is comprised of a transistor 400 coupled to a voltage source V+. When the transistor is turned on, the odd or even bit line to which the precharge circuit 322 is coupled through the multiplexing circuit is charged up to the V+ voltage.

The TDC circuit 323 is comprised of a capacitor 401 for temporarily storing data input to the circuit 323.

The DDC1_1, DDC1_2, and DDC2 circuits 325, 324, 328 are comprised of substantially similar circuits that include a transistor 420, 421, 422 coupled to a regulated voltage REG. The circuits 325, 324, 328 additionally have transistor circuits 411, 410, 412 for controlling multiple level programming as discussed previously.

The PDC circuit 326 includes dual transistor flip-flop circuits 430, 431 for storing the sensed data or the data to be programmed. The SDC circuit 327 is also comprised of dual transistor flip-flop circuits 440, 441 that have substantially the same configuration as the PDC flip-flop circuits 430, 431. The SDC circuit 327 is coupled to an I/O of the DDC 100.

Figure 7:
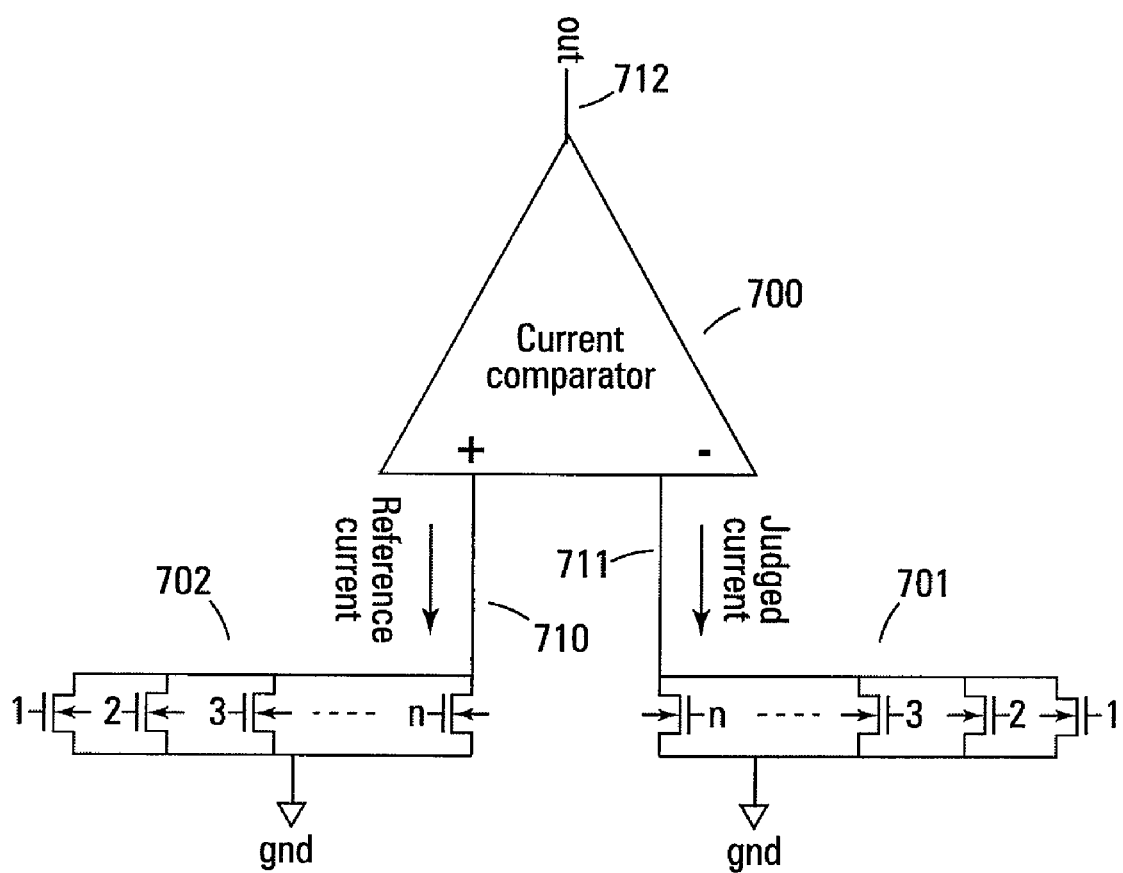
FIG. 7 shows a schematic diagram of one embodiment of a current comparator circuit in accordance with an internal verify read operation.

In determining whether a target memory block or other grouping of memory cells is unusable, a small unit internal verify read operation is performed as illustrated subsequently with reference to FIGS. 5 and 7. This operation reads a first group of columns of memory cells, e.g., odd columns, then reads a second group of columns of memory cells, e.g., even columns (or vice versa). The data that is read is compared to data that is expected to determine which memory blocks are unusable. This comparison, in one embodiment, is accomplished by an internal verify read (IVR) 510 sequence. The IVR sequence is described subsequently in greater detail with reference to FIG. 7.

Prior to the compare operation, the number of read columns to be compared is reduced by a masking operation. For example, 4 k bytes of columns may be read but a subset of those columns (e.g., 3 k bytes of columns) are masked so that only 1 k bytes of columns are actually compared. Thus, a fixed number of error bits that represented the 4 k bytes of columns now represents the errors in only 1 k bytes of columns, resulting in a more accurate representation of the quantity of bad columns. The small unit internal verify read operation accomplished more accurate judgments in exchange for a longer test time as a conventional internal verify read operation. In other words, if 3 k bytes of 4 k byte columns are masked, the small unit internal verify read operation should be performed four times to check all of the columns of one page. The criteria of allowed error bits per a certain quantity of columns determine the count fail byte (CFBYTE) indicator.

Each memory block has a bad block latch that is associated with that particular memory block and that is indicative whether the particular memory block is unusable. The CFBYTE indicator, in one embodiment, is set by a trim register to indicate the criteria of the allowed error bits as determined during the design process of the memory device. For example, in a conventional prior art internal verify read operation, if error correction coding could correct 1 bit per 4 k bytes of data, the CFBYTE in the trim register would be set to "1". Using the small unit internal verify read operation of the present embodiments, the CFBYTE set to "1" represents that the error correction coding can correct 1 bit per 1 k bytes of data.

The error bit indicator is determined by the number of defective cells in a group of cells. For example, if a read of page 0 results in one error and a read of page 1 results in 3 errors, the error bit indicator for page 0 is 1 and the error bit indicator for page 1 is 3.

During the comparison, the CFBYTE indicator is compared to the error bit indicator. If the error bit indicator is larger than the CFBYTE indicator, the block is marked as unusable. A voltage or current might be representative of each of the CFBYTE indicator and error bit indicator.

Figure 5:
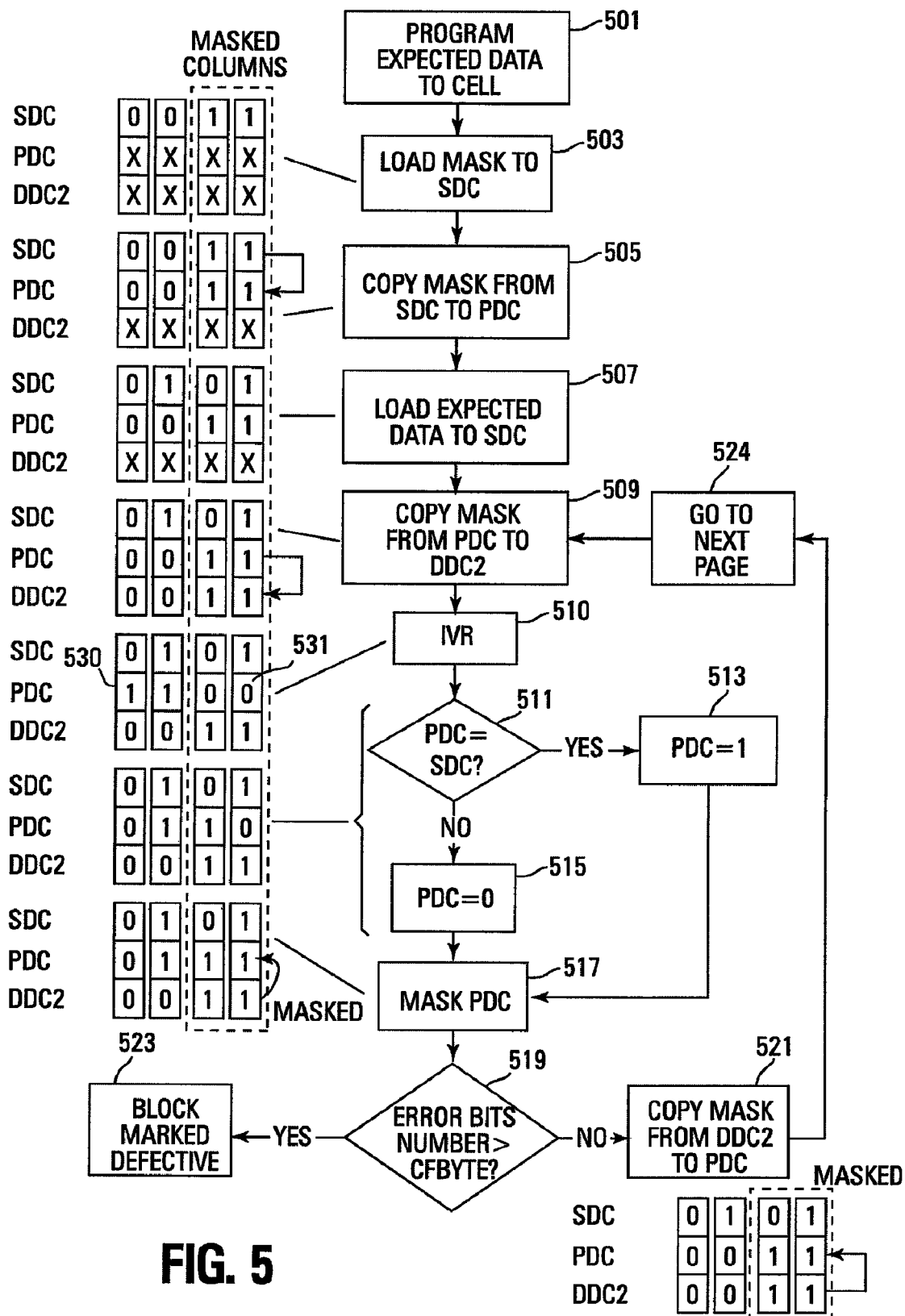
FIG. 5 shows a flowchart, with corresponding data cache operation, in accordance with one embodiment of the method for small unit internal verify read operation.

FIG. 5 illustrates a flowchart of one embodiment of a method for a small unit internal verify read operation. This figure also shows the data cache operations corresponding to each step.

For purposes of brevity, only four columns of the SDC, PDC, and DDC2 caches are shown. Each column of the SDC, PDC, and DDC2 of FIG. 5 represents a different column of memory cells of the memory array, as illustrated in FIGS. 2 and 3. The two right columns within the dotted line are the columns that are to be masked by the subsequently described embodiment of the method for small unit internal verify read operation. The masked columns are indicated by the logical "11" mask bits. The present embodiments are not limited to masking any certain columns or any certain number of columns.

The method begins when one or more target memory cells are programmed with target data 501. Mask data is loaded into the SDC 503. In one embodiment, the mask data is always a logical "1". Since the right two columns are being masked, a logical "1" is loaded into the SDC for each of those two columns as shown. If different columns were being masked, only those masked columns would have the mask data loaded into their respective SDC's. An alternate embodiment can use a logical "0" as mask data.

The mask data is then copied from the SDC to the PDC 505 and the expected data is loaded into the SDC 507. The expected data is that data to which the memory cell under test was supposed to have been programmed. Thus, this is setting up a comparison between the expected data just loaded into the SDC and the data that was already programmed into the memory cell.

The mask is copied from the PDC 510 to the DDC2 509. An internal verify read operation is then performed on the target memory cells and the read data is stored in the PDC.

The IVR operation makes the PDC to which defective cells are coupled to be a logical "0". A current comparison is performed with a current comparator circuit, as illustrated in FIG. 7, in order to judge whether the number of defective cells is less than a criteria of allowed error bits. A reference current (CFBYTE) 710 represents the criteria of allowed error bits. A judged current (error bit indicator) 711 represents the number of defective cells in a group of cells. If the reference current 710 is greater than or equal to the judged current 711, the output 712 of the current comparator circuit 700 indicates a pass result (e.g., logical "1"). If the reference current 710 is less than the judged current 711, the output 712 of the current comparator circuit 700 indicates a failed result (e.g., logical "0").

As an example of the IVR sequence, if the number of allowed error bits is three, then three of n transistors 702 on the left side would be turned on and the reference current 710 would be 3 µA. If the number of defective cells is two, then two of n transistors 701 on the right side would be turned on and the judged current 711 would be 2 µA. In this case, the reference current 710 is larger than the judged current 711 and, therefore, the output 712 of the current comparator circuit 700 indicates a pass result. This means the target page or group of IVR or small unit IVR is within the specified tolerance criteria.

The read data stored in the PDC is then compared to the expected data of "0101" that was stored in the SDC 511. This comparison operation is performed by use of DDC1_1 and DDC1_2. If the PDC data is the same as the SDC data (i.e., the read data and expected data are the same), the PDC is loaded with a logical 1 513. If the PDC data is not the same as the SDC data, the PDC is loaded with a logical error bit indicactor (e.g., logical 0) 515 to indicate that this bit location has stored defective data.

It can be seen in the cache diagrams of FIG. 5 that the first bit 530 and the last bit 531 in the PDC are errors. Thus, the error bits of the PDC are loaded with logical "0" and the correct bits of the PDC are loaded with logical "1".

The mask data is in the DDC2 and is used to mask the PDC data 517 of the right two columns enclosed in the dotted line. Thus, even though the last bit 531 was an error bit that was changed to a 0 in the PDC, the masking operation of the last two columns changes all masked columns to logical "1" in the PDC. The error bit indicator in this example would have been two. However, since the last two columns were masked, all errors in these columns are ignored. The error bit indicator in this example is therefore 1.

The error bit indicator of 1 is then compared to the CFBYTE indicator 519 that was determined as described previously. If the comparison indicates a number of errors that have been deemed acceptable, e.g., the error bit indicator is less than or equal to the CFBYTE indicator, the mask in the DDC2 is copied to the PDC 521. The method goes to the next page of data of the memory block 524 and repeats from the step of copying the mask data from the PDC to the DDC2 509 to refresh the DDC2 data. If the comparison indicates a number of errors that have been deemed unacceptable, e.g, the CFBYTE indicator is less than the error bit indicator 519, the memory block is marked as an unusable block 523 and the small unit internal verify read operation is complete. In other words, if the number of defective bits read is greater than a threshold, the block is marked as unusable.

Figure 6:
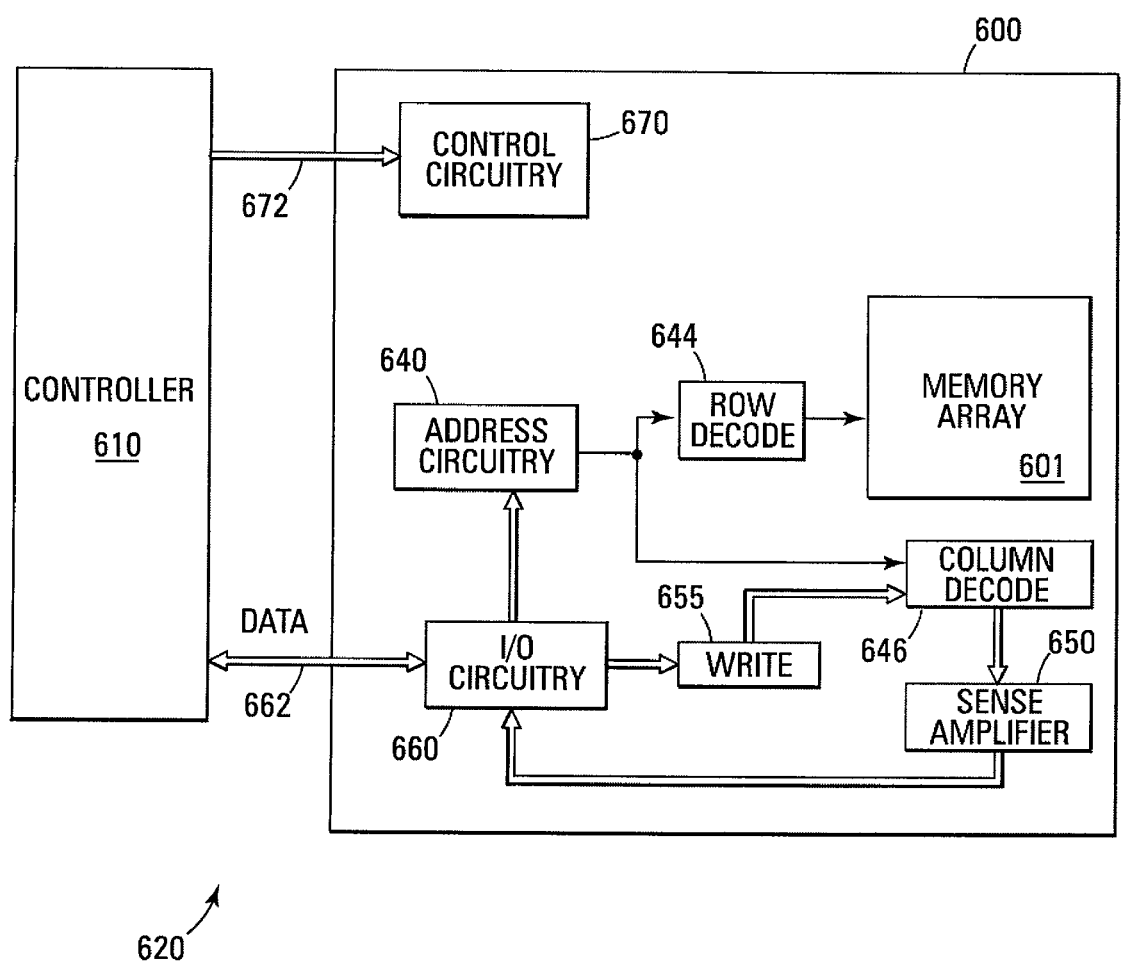
FIG. 6 shows a block diagram of one embodiment of a memory system in accordance with the memory device of FIG. 1.

FIG. 6 illustrates a functional block diagram of a memory device 600. The memory device 600 is coupled to an external controller 610. The controller 610 may be a microprocessor or some other type of controlling circuitry. The memory device 600 and the controller 610 form part of a memory system 620. The memory device 600 has been simplified to focus on features of the memory that are helpful in understanding the present invention.

The memory device 600 includes an array 101 of non-volatile memory cells, such as the one illustrated previously in FIG. 1. The memory array 101 is arranged in banks of word line rows and bit line columns. In one embodiment, the columns of the memory array 101 are comprised of series strings of memory cells as illustrated in FIG. 2. As is well known in the art, the connections of the cells to the bit lines determines whether the array is a NAND architecture, an AND architecture, or a NOR architecture.

Address buffer circuitry 640 is provided to latch address signals provided through the I/O circuitry 660. Address signals are received and decoded by a row decoder 644 and a column decoder 646 to access the memory array 101. It will be appreciated by those skilled in the art, with the benefit of the present description, that the number of address input connections depends on the density and architecture of the memory array 101. That is, the number of addresses increases with both increased memory cell counts and increased bank and block counts.

The memory device 600 reads data in the memory array 101 by sensing voltage or current changes in the memory array columns using sense amplifier circuitry 650. The sense amplifier circuitry 650, in one embodiment, is coupled to read and latch a row of data from the memory array 630. Data input and output buffer circuitry 660 is included for bidirectional data communication as well as address communication over a plurality of data connections 662 with the controller 610. Write circuitry 655 is provided to write data to the memory array.

Memory control circuitry 670 decodes signals provided on control connections 672 from the external controller 610. These signals are used to control the operations on the memory array 101, including data read, data write (program), and erase operations. The memory control circuitry 670 may be a state machine, a sequencer, or some other type of control circuitry to generate the memory control signals. In one embodiment, the memory control circuitry 670 is configured to execute the embodiments of the sense method of the present disclosure.

The flash memory device illustrated in FIG. 6 has been simplified to facilitate a basic understanding of the features of the memory. A more detailed understanding of internal circuitry and functions of flash memories are known to those skilled in the art.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for a verify read in a memory device, the method comprising:
    performing a read operation of a plurality of columns of memory cells of a grouping of columns of the memory device;
    masking a subset of the plurality of read columns of memory cells; and
    determining if the grouping of columns is unusable in response to only those columns of the grouping of columns that are not masked.

2. The method of claim 1 wherein the plurality of columns of memory cells comprise a first page of data.

3. The method of claim 1 wherein the grouping of columns is a memory block.

4. The method of claim 1 and further comprising storing mask data, for masking the subset of the plurality of read columns of memory cells, into a data cache of the memory device.

5. The method of claim 1 wherein determining if the grouping of columns is unusable comprises comparing read data from the read operation to expected data that was programmed into the plurality of columns of memory cells.

6. The method of claim 2 wherein performing the read operation is performed on each page of data of the grouping of columns of the memory device prior to determining if the grouping of columns is unusable.

7. The method of claim 1 wherein masking the subset of the plurality of read columns comprises masking a different data cache associated with each column of the subset of the plurality of read columns.

8. A method for a verify read in a memory device, the method comprising:
    programming expected data to a grouping of memory cells;
    storing mask data to a first plurality of caches, each cache bit associated with a different column of the grouping of memory cells;
    copying the mask data from the first plurality of caches to a second plurality of caches, each cache bit associated with a different column of the grouping of memory cells;
    storing the expected data to the first plurality of caches;
    copying the mask data from the second plurality of caches to a third plurality of caches, each cache bit associated with a different column of the grouping of memory cells;
    reading data from a subset of the grouping of memory cells;
    comparing the read data with the expected data;
    storing, in response to comparing, an error indication in bit locations of the second plurality of caches for each column having an error bit;
    masking particular bit locations of the second plurality of data caches in response to the mask data;
    comparing a reference current to a judged current; and
    marking the grouping of memory cells unusable in response to comparing the reference current to the judged current.

9. The method of claim 8 wherein comparing the read data with the expected data comprises comparing the second plurality of caches to the first plurality of caches.

10. The method of claim 8 wherein the first plurality of caches are secondary data caches, the second plurality of caches are primary data caches, and the third plurality of caches are dynamic data caches.

11. The method of claim 8 wherein the error indication is a logical error bit indicator.

12. The method of claim 8 wherein comparing the reference current to the judged current comprises:
- turning on a first quantity of transistors indicative of a criteria of allowed error bits to generate the reference current;
- turning on a second quantity of transistors indicative of a quantity of defective memory cells that are not masked to generate the judged current; and
- marking the grouping of memory cells unusable if the judged current is greater than the reference current.

13. A memory device comprising:
- an array of memory cells organized in columns and rows;
- a plurality of data caches coupled to the array of memory cells, each column associated with a different bit location of each data cache; and
- memory control circuitry coupled to the array of memory cells, the memory control circuitry is configured to execute a read operation of a group of columns of the array of memory cells, the memory control circuitry further configured to store an error indication for each data cache bit location associated with a column of the group of columns having an error, mask a subset of the data cache bit locations, and determine if the group of columns is unusable in response to only those bit locations that are unmasked.

14. The memory device of claim 13 wherein the array of memory cells is comprised of a NAND architecture of non-volatile memory cells.

15. The memory device of claim 13 wherein the plurality of data caches are organized as primary data caches, secondary data caches, and first, second, and third dynamic data caches.

16. The memory device of claim 13 wherein the plurality of data caches are coupled through a multiplexing circuit such that the plurality of data caches are coupled to only one of odd memory cell columns or even memory cell columns at a time.

17. The memory device of claim 16 and further comprising a precharge circuit and a temporary data cache coupled to the array of memory cells through the multiplexing circuit.

18. The memory device of claim 15 wherein the memory control circuitry is further configured to refresh the mask data stored in the third dynamic data cache.

19. The memory device of claim 15 wherein the memory control circuitry is further configured to store expected data in the secondary data cache, read data in the primary data cache, and mask data in the third dynamic data cache.

20. The memory device of claim 19 wherein the memory control circuitry is further configured to use the mask data in the third dynamic data cache to mask particular bit locations of the primary data cache.

* * * * *